United States Patent
Lu et al.

(10) Patent No.: US 9,685,531 B2
(45) Date of Patent: Jun. 20, 2017

(54) METHOD FOR MANUFACTURING SEMICONDUCTOR DEVICE HAVING METAL GATE

(71) Applicant: UNITED MICROELECTRONICS CORP., Hsin-Chu (TW)

(72) Inventors: Chia-Lin Lu, Taoyuan (TW); Chun-Lung Chen, Tainan (TW); Kun-Yuan Liao, Hsin-Chu (TW); Feng-Yi Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/263,349

(22) Filed: Sep. 12, 2016

(65) Prior Publication Data
US 2016/0380077 A1    Dec. 29, 2016

Related U.S. Application Data

(62) Division of application No. 14/510,126, filed on Oct. 9, 2014, now Pat. No. 9,490,334.

(30) Foreign Application Priority Data

Sep. 9, 2014    (CN) .......................... 2014 1 0454861

(51) Int. Cl.
*H01L 21/3205* (2006.01)
*H01L 21/4763* (2006.01)
(Continued)

(52) U.S. Cl.
CPC .................. *H01L 29/66545* (2013.01); *H01L 21/823842* (2013.01); *H01L 27/0883* (2013.01);
(Continued)

(58) Field of Classification Search
CPC ......... H01L 27/10823; H01L 27/10876; H01L 29/42336; H01L 29/42352; H01L 29/4236;
(Continued)

(56) References Cited

U.S. PATENT DOCUMENTS

2007/0262451 A1*  11/2007  Rachmady ........ H01L 21/28088
                                                257/758
2012/0068261 A1*  3/2012  Kwon ................. H01L 27/0922
                                                257/331
(Continued)

*Primary Examiner* — Sonya D McCall Shepard
(74) *Attorney, Agent, or Firm* — Winston Hsu

(57) ABSTRACT

A method for manufacturing a semiconductor device having metal gates includes following steps. A substrate including a first transistor and a second transistor formed thereon is provided. The first transistor includes a first gate trench and the second transistor includes a second gate trench. A patterned first work function metal layer is formed in the first gate trench and followed by forming a second sacrificial masking layer respectively in the first gate trench and the second gate trench. An etching process is then performed to form a U-shaped first work function metal layer in the first gate trench. Subsequently, a two-step etching process including a strip step and a wet etching step is performed to remove the second sacrificial masking layer and portions of the U-shaped first work function metal layer to form a taper top on the U-shaped first work function metal layer in the first gate trench.

11 Claims, 4 Drawing Sheets

(51) Int. Cl.

| | |
|---|---|
| *H01L 29/66* | (2006.01) |
| *H01L 29/423* | (2006.01) |
| *H01L 27/088* | (2006.01) |
| *H01L 29/51* | (2006.01) |
| *H01L 29/40* | (2006.01) |
| *H01L 21/8238* | (2006.01) |
| *H01L 27/092* | (2006.01) |

(52) U.S. Cl.
CPC .......... *H01L 27/092* (2013.01); *H01L 29/401* (2013.01); *H01L 29/42376* (2013.01); *H01L 29/512* (2013.01)

(58) Field of Classification Search
CPC ......... H01L 29/66704; H01L 29/66734; H01L 29/7397; H01L 29/7813; H01L 29/7825; H01L 21/02054; H01L 21/30617; H01L 21/30621; H01L 21/31144; H01L 29/66621
USPC ....... 438/734, 713, 706–710, 704, 701, 700, 438/695, 692, 259, 176, 156, 154, 153, 438/589, 652, 673, 671
See application file for complete search history.

(56) References Cited

U.S. PATENT DOCUMENTS

| | | |
|---|---|---|
| 2013/0299918 A1 | 11/2013 | Kim |
| 2014/0131809 A1 | 5/2014 | Ando |

\* cited by examiner

METHOD FOR MANUFACTURING SEMICONDUCTOR DEVICE HAVING METAL GATE

CROSS REFERENCE TO RELATED APPLICATIONS

This application is a division of U.S. application Ser. No. 14/510,126 filed on Oct. 9, 2014, and incorporated herein by reference in its entirety.

BACKGROUND OF THE INVENTION

1. Field of the Invention

The invention relates to a semiconductor device having metal gate and manufacturing method thereof, and more particularly, to a semiconductor device having metal gate and manufacturing method capable of providing superior gap-filling result.

2. Description of the Prior Art

With a trend toward scaling down the size of the semiconductor device, work function metals are used to replace the conventional polysilicon gate to be the control electrode that competent to the high dielectric constant (herein after abbreviated as high-k) gate dielectric layer. The conventional metal gate methods are categorized into the gate first process and the gate last process. Among the two main processes, the gate last process is able to avoid processes of high thermal budget and to provide wider material choices for the high-k gate dielectric layer and the metal gate, and thus the gate last process gradually replaces the gate first process.

In the conventional gate last process, a dummy gate or a replacement gate is formed on a substrate and followed by steps of forming a conventional metal-oxide semiconductor (MOS) semiconductor device. Subsequently, the dummy/replacement gate is removed to form a gate trench. Then the gate trench is filled with work function metals required by different conductivity types. As the line width of the semiconductor device keeps shrinking, the aspect ratio of the gate trench becomes more and more critical when filling the gate trench with the metal layers. Briefly speaking, when the line width of the semiconductor device is reduced, the opening width of the gate trench is consequently reduced, and thus it is difficult to fill the gate trench with the metals, it even causes a seam left in the metal gate after forming the metal layers in the gate trench. Eventually, the electrical performance of the semiconductor device having the metal gate is deteriorated.

Accordingly, though the gate last process is able to avoid processes of high thermal budget and to provide wider material choices for the high-k gate dielectric layer and the metal gate, the gate last process still faces integrity requirements for the complicated processes and reliability requirement for the layers filling in the gate trench.

SUMMARY OF THE INVENTION

According to an aspect of the present invention, a method for manufacturing a semiconductor device having metal gates is provided. According to the method for manufacturing the semiconductor device having the metal gates, a substrate including a first transistor and a second transistor formed thereon is provided. The first transistor includes a first gate trench formed therein and the second transistor includes a second gate trench formed therein. Next, a patterned first work function metal layer is formed in the first gate trench and followed by forming a second sacrificial masking layer respectively in the first gate trench and the second gate trench. After forming the second sacrificial masking layer, an etching process is performed to remove portions of the patterned first work function metal layer to form a U-shaped first work function metal layer in the first gate trench. Then, a two-step etching process is performed to remove the second sacrificial masking layer and portions of the U-shaped first work function metal layer to form a taper top on the U-shaped first work function metal layer in the first gate trench. The two-step etching process includes a strip step and a wet etching step.

According to another aspect of the present invention, a semiconductor device having metal gates are provided. The semiconductor device includes a substrate, a first metal gate positioned on the substrate, and a second metal gate positioned on the substrate. The first metal gate includes a first work function metal layer having a taper top, and the second metal gate includes a second work function metal layer. The first work function metal layer and the second work function metal layer are complementary to each other.

According to the method for manufacturing the semiconductor device having the metal gates provided by the present invention, the taper top of the first work function metal layer is obtained by performing the two-step etching process, and the taper top of the first work function metal layer provides a larger opening width, thus the metal layers are more easily formed in the gate trench. Consequently, the semiconductor device having the metal gates provided by the present invention has the advantage of superior gap-filling result and improved reliability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are drawings illustrating a method for manufacturing a semiconductor device having metal gates provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
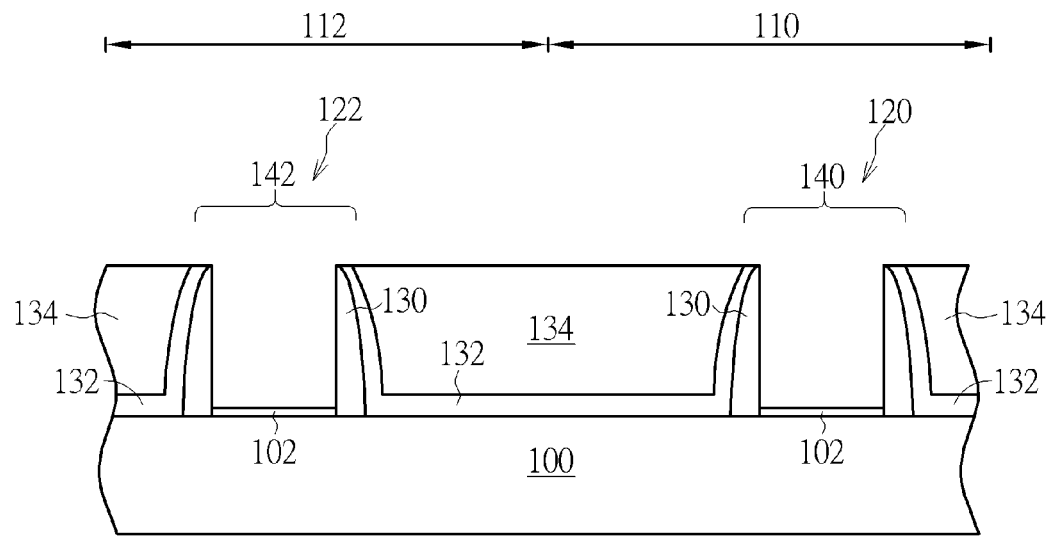

Please refer to FIGS. 1-8, which are drawings illustrating a method for manufacturing a semiconductor device having metal gates provided by a preferred embodiment of the present invention. As shown in FIG. 1, the preferred embodiment first provides a substrate such as a silicon substrate, a silicon-containing substrate, or a silicon-on-insulator (hereinafter abbreviated as SOI) substrate. The substrate includes a plurality of shallow trench isolations (hereinafter abbreviated as STIs) (not shown), and the STIs are used to define a plurality of active regions for accommodating p-typed transistors and n-typed transistors and to provide electrical isolation. In the preferred embodiment, a semiconductor layer such as a fin structure involved in fin field effect transistor (FinFET) approach is provided. The fin structure as shown in FIG. 1 can be formed by patterning a single crystalline silicon layer of a SOI substrate or a bulk silicon substrate. And the fin structure is taken as the substrate 100 in the preferred embodiment. As shown in FIG. 1, a first active region 110 and a second active region 112 are defined in the substrate 100 (the fin structure). A first transistor 120 is formed in the first active region 110 and a second transistor 122 is formed in the second active region 112. The first transistor 120 includes a first conductivity type, the second transistor 122 includes a second conductivity type, and the first conductivity type and the second conductivity type are complementary. In the preferred embodiment, the first transistor 120 is a p-typed semiconductor device and the second transistor 122 is an n-typed semiconductor device. However those skilled in the art should easily realize that it can be vice versa.

Please refer to FIG. 1. The first transistor 120 and the second transistor 122 respectively include a dielectric layer 102, a dummy gate or a replacement gate such as a polysilicon layer (not shown), and a patterned hard mask (not shown). The dielectric layer 102 can be a conventional silicon oxide (SiO) layer in the preferred embodiment, but not limited to this. Furthermore, the first transistor 120 and the second transistor 122 respectively include first lightly doped drains (LDDs) (not shown) and second LDDs (not shown), a spacer 130, a first source/drain (not shown) and a second source/drain (not shown). The spacers 130 can be multi-layered structures, but not limited to this. Furthermore, selective strain scheme (SSS) can be used in the preferred embodiment. For example, a selective epitaxial growth (SEG) method can be used to form the first source/drain and the second source/drain. In accordance with the preferred embodiment, since the first transistor 120 is the p-typed transistor and the second transistor 122 is the n-typed transistor, epitaxial silicon layers of SiGe are used to form the first source/drain while epitaxial silicon layers of SiC are used to form the second source/drain. Additionally, salicides (not shown) are respectively formed on the first source/drain and the second source/drain. After forming the first transistor 120 and the second transistor 122, a contact etch stop layer (hereinafter abbreviated as CESL) 132 and an inter-layer dielectric (hereinafter abbreviated as ILD) layer 134 are sequentially formed. Since the steps and material choices for the abovementioned elements are well-known to those skilled in the art, those details are omitted herein in the interest of brevity.

Please still refer to FIG. 1. Next, a planarization process is performed to remove a portion of the ILD layer 134 and a portion of the CESL 132 and the patterned hard mask, consequently the dummy gates of the first transistor 120 and the second transistor 122 are exposed. Then, a suitable etching process is performed to remove the dummy gates, and thus a first gate trench 140 is formed in the first transistor 120 and a second gate trench 142 is formed in and the second transistor 122, simultaneously.

Figure 2:
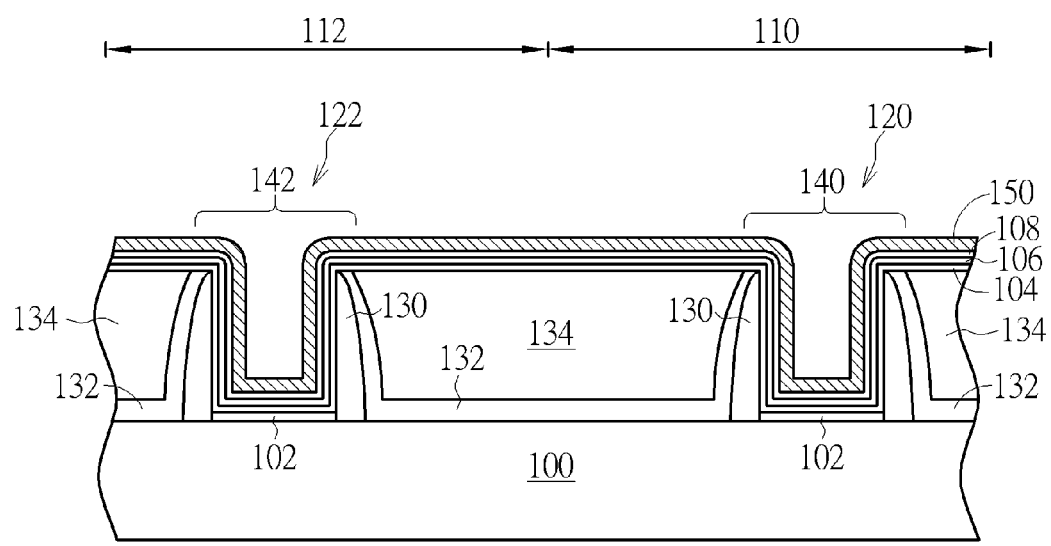

Please refer to FIG. 2. After forming the first gate trench 140 and the second gate trench 142, a high-k gate dielectric layer 104 is formed in the first gate trench 140 and the second gate trench 142. The high-k gate dielectric layer 104 is used to replace the conventional silicon oxide to be the gate dielectric layer for decreasing physical limit thickness, reducing leakage current, and obtaining equivalent capacitor in an identical equivalent oxide thickness (EOT). The high-k gate dielectric layer 104 can include high-k material selected from the group consisting of silicon nitride (SiN), silicon oxynitride (SiON) and metal oxide. And the metal oxide can include hafnium oxide (HfO), hafnium silicon oxide (HfSiO), hafnium silicon oxynitride (HfSiON), aluminum oxide (AlO), lanthanum oxide (LaO), lanthanum aluminum oxide (LaAlO), tantalum oxide (TaO), zirconium oxide (ZrO), strontium zirconium silicon oxide (ZrSiO), or hafnium zirconium oxide (HfZrO), but not limited to this. It is noteworthy that the preferred embodiment is integrated with the high-k last process. However, the method for manufacturing the semiconductor device having the metal gates can be integrated with a high-k first process according to a modification to the preferred embodiment, and in such modification, the dielectric layer 102 can be formed of the abovementioned high-k materials, but not limited to this.

Please still refer to FIG. 2. A bottom barrier layer 106, an etch stop layer 108 and a first work function metal layer 150 are sequentially formed in both the first gate trench 140 and the second gate trench 142. According to the preferred embodiment, the bottom barrier layer 106 can include titanium nitride (hereafter abbreviated as TiN), but not limited to this. The etch stop layer 108 includes an etching rate different from an etching rate of the first work function metal layer 150. According to the preferred embodiment, the etch stop layer 108 can include tantalum nitride (hereafter abbreviated as TaN), but not limited to this. The first work function metal layer 150 is a p-typed work function metal layer and exemplarily includes TiN, TaN, titanium carbide (TiC), tantalum carbide (TaC), tungsten carbide (WC), or aluminum titanium nitride (TiAlN), but not limited to this. It should be easily realized that since the first transistor 120 is a p-typed transistor, the first work function metal layer 150 can include any suitable metal material having a work function between about 4.8 eV and about 5.2 eV. In addition, the first work function metal layer 150 can be a single-layered structure or a multi-layered structure.

Figure 3:
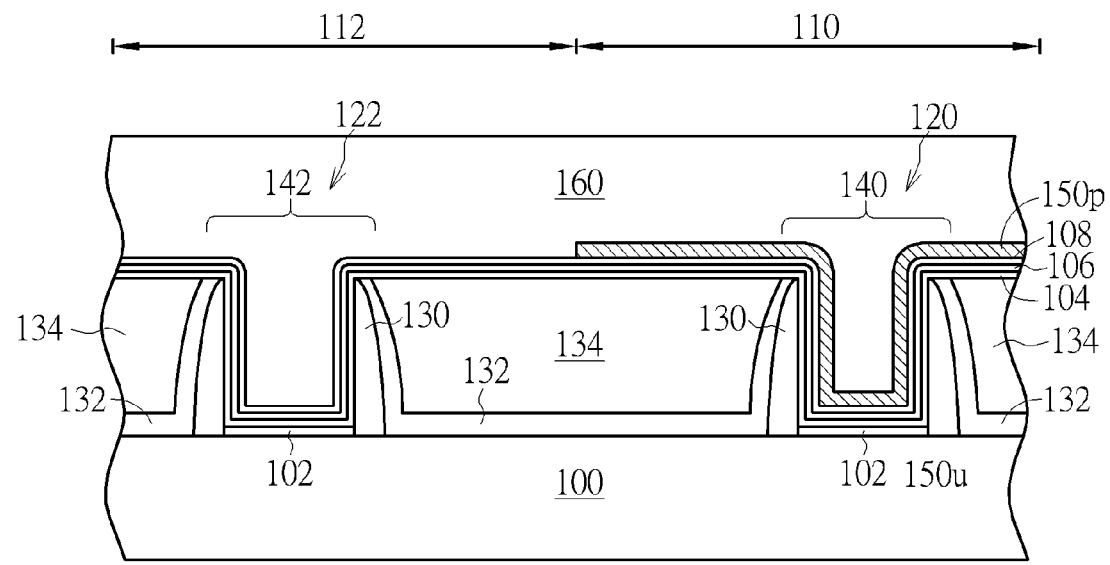

Please refer to FIG. 3. Next, a patterned photoresist (not shown) is formed on the substrate 100. The patterned photoresist covers the first active region 110 but exposes the second active region 112. A proper etching process is then performed to remove portions of the first work function metal layer 150 from the second active region 112, particularly to remove the first work function metal layer 150 from the second gate trench 142. Consequently, a patterned first work function metal layer 150p is formed in the first gate trench 140. It is noteworthy that the etch stop layer 108 renders protection to the bottom barrier layer 106 and the high-k gate dielectric layer 104 due to the difference between the etching rates of the etch stop layer 108 and the first work function metal layer 150. Thus, the bottom barrier layer 106 and the high-k gate dielectric layer 104 are impervious to the etching process.

Please still refer to FIG. 3. After forming the patterned first work function metal layer 150p, a first sacrificial masking layer 160 is formed on the substrate 100. The first sacrificial masking layer 160 includes a superior gap-filling ability and includes, for example but not limited to, a bottom anti-reflective coating (BARC), a ultraviolet light absorbing oxide (DUO) material layer, a spin-on glass (SOG) layer, a sacrificial light absorbing material (SLAM) layer, an oxide-rich layer, or a photoresist. As shown in FIG. 3, the first gate trench 140 and the second gate trench 142 are filled up with the first sacrificial masking layer 160. In addition, the first sacrificial masking layer 160 can be a single-layered structure as shown in FIG. 3, or a multi-layer.

Figure 4:
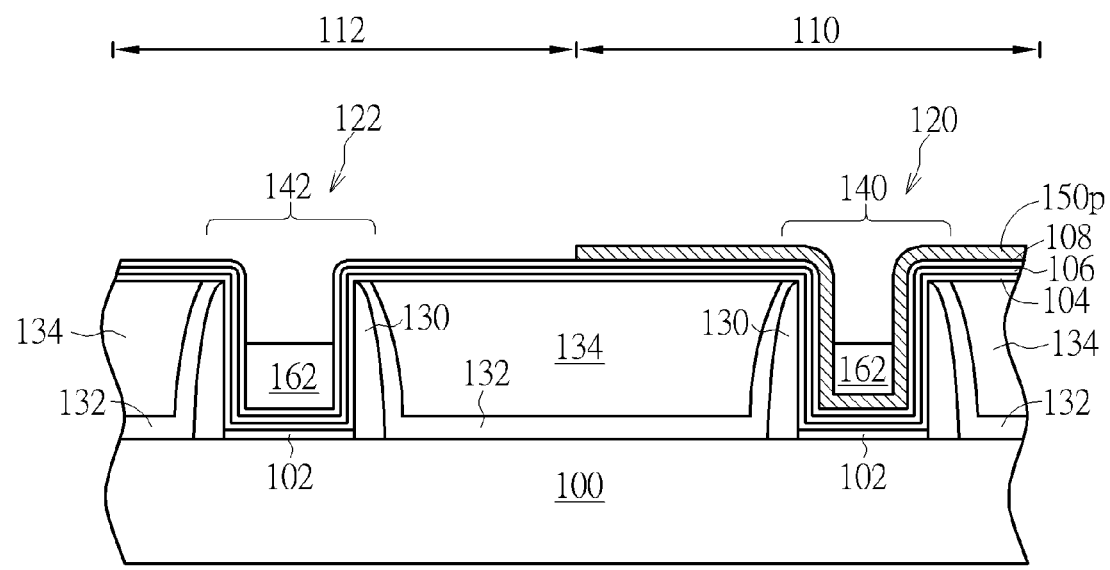

Please refer to FIG. 4. Next, an etching back process is performed to form a second sacrificial masking layer 162 in the first gate trench 140 and the second gate trench 142. More important, a top surface of the second sacrificial masking layer 162 is lower than an opening of the first gate trench 140 and an opening of the second gate trench 142 after the etching back process, as shown in FIG. 4. However, the second sacrificial masking layer 162 covers and protects entire bottoms of the first gate trench 140 and the second gate trench 142.

Figure 5:
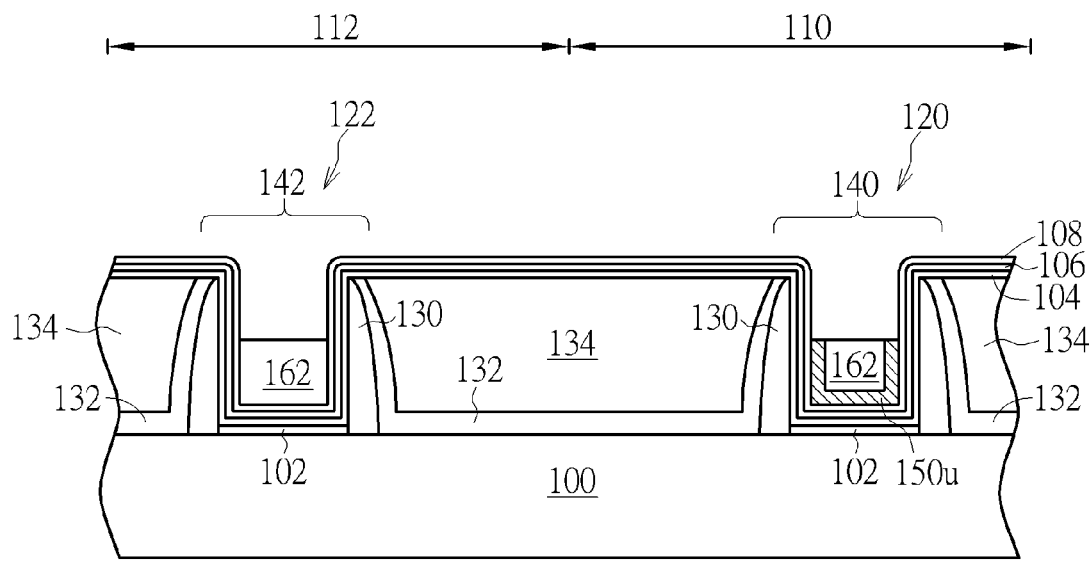

Please refer to FIG. 5. After forming the second sacrificial masking layer 162, an etching process is performed to remove portions of the patterned first work function metal layer 150p in the first active region 110. It is noteworthy that since portions of the patterned first work function metal layer 150p in the first gate trench 140 is covered and protected by the second sacrificial masking layer 162, only the exposed patterned first work function metal layer 150p is removed and thus a U-shaped first work function metal layer 150u is formed in the first gate trench 140. As shown in FIG. 5, topmost portions of the U-shaped first work function metal layer 150u are all lower than the opening of the first gate trench 140. Please refer to FIG. 5 together with FIG. 4. It is found that a height of the topmost portion of the U-shaped first work function metal layer 150u is defined by a height of the second sacrificial masking layer 162.

Figure 6:
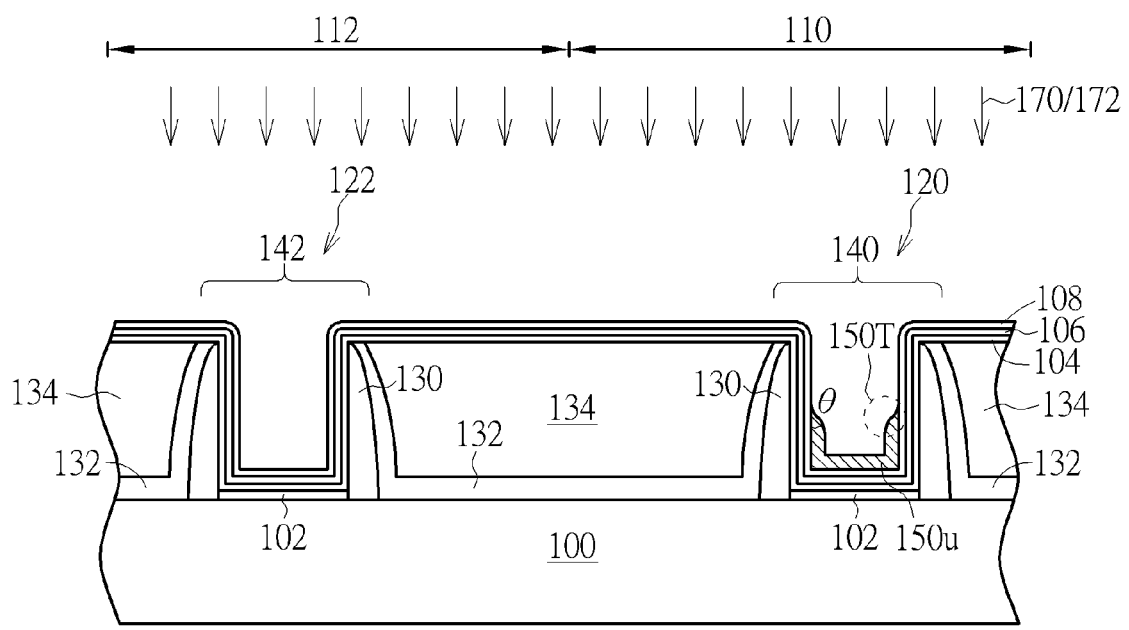

Please refer to FIG. 6. A two-step etching process 170/172 is then performed to remove the second sacrificial masking layer 162 from the first gate trench 140 and the second gate trench 142, and to remove portions of the U-shaped first work function metal layer 150u from the first gate trench 140. According the preferred embodiment, the two-step etching process 170/172 can include a strip step 170 and a wet etching step 172. The strip step 170 is performed to remove the second sacrificial masking layer 162 with a plasma without bombardment force in a plasma chamber. In other words, the strip step 170 is performed without ion bombardment effect. Additionally, the strip step 170 includes introducing $H_2/N_2$ gas. After the strip step 170, the wet etching step 172 is performed with diluted hydrofluoric acid (DHF).

Please still refer to FIG. 6. In the preferred embodiment, the two-step etching process 170/172 is performed to remove the second sacrificial masking layer 162 from the first gate trench 140 and the second gate trench 142. More important, the two-step etching process 170/172 is performed to remove portions of the U-shaped first work function metal layer 150u from the first gate trench 140. Thus a taper top 150T is formed on the topmost portion of the U-shaped first work function metal layer 150u. It is noteworthy that the taper top 150T includes an included angle θ, and the included angle θ is smaller than 45°. Comparing the U-shaped first work function metal layer 150u before and after performing the two-step etching process 170/172 as shown in FIG. 5 and FIG. 6, the U-shaped first work function metal layer 150u before the two-step etching process 170/172 includes no taper top and its included angle is larger than 45°.

Figure 7:
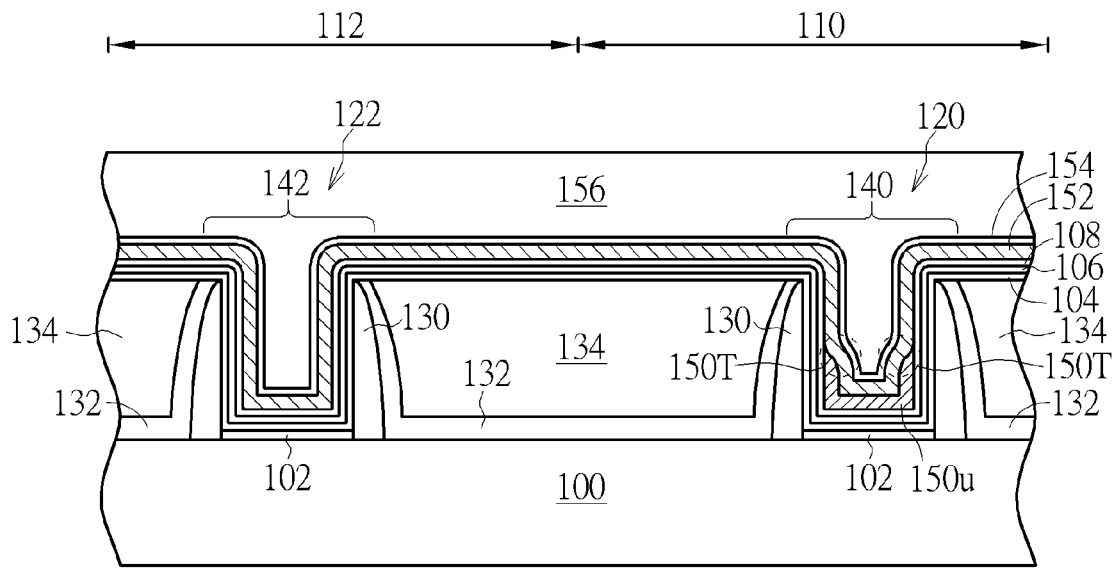

Please refer to FIG. 7. After performing the two-step etching process 170/172, a second work function metal layer 152, a top barrier layer 154 and a gap-filling metal layer 156 are sequentially formed in the first gate trench 140 and the second gate trench 142. The second work function metal layer 152 and the U-shaped first work function metal layer 150u are complementary with each other. Therefore, the second work function metal layer 152a includes an n-typed work function metal layer such as titanium aluminide (TiAl), zirconium aluminide (ZrAl), tungsten aluminide (WAl), tantalum aluminide (TaAl), or hafnium aluminide (HfAl), but not limited to this. It should be easily realized that since the second transistor 122 is an n-typed transistor, the second work function metal layer 152 can include any suitable metal materials having a work function between about 3.9 eV and about 4.3 eV. In addition, the second work function metal layer 152 can be a single-layered structure or a multi-layered structure. In the preferred embodiment, the top barrier layer 154 can include TiN, but not limited to this. In the preferred embodiment, the gap-filling metal layer 156 includes materials with low resistance and superior gap-filling characteristic, the materials can be selected from the group consisting of such as Al, Ti, Ta, W, Nb, Mo, Cu, TiN, TiC, TaN, Ti/W and Ti/TiN.

Figure 8:
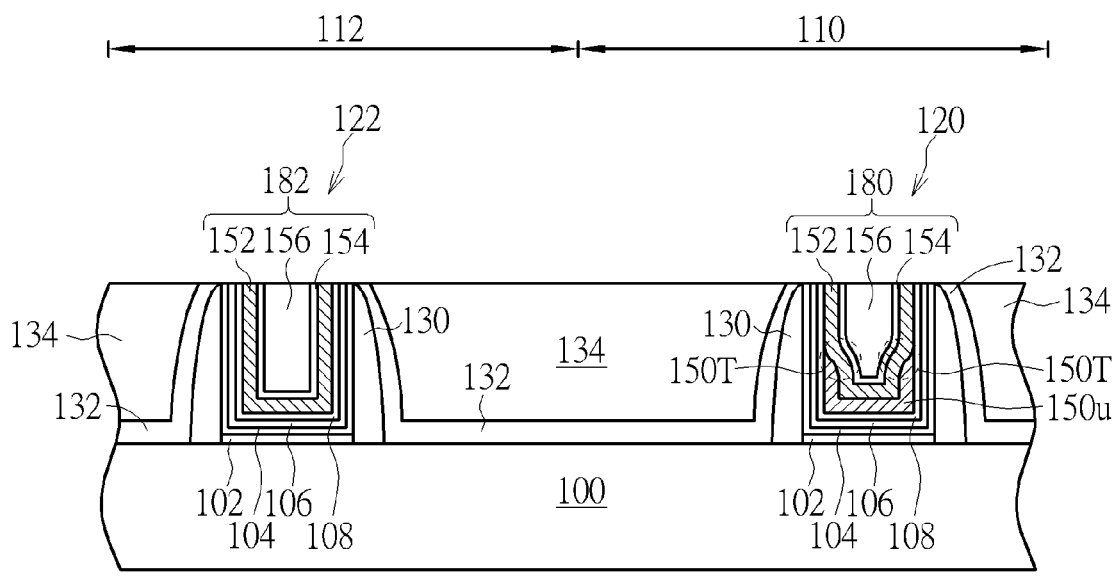

Please refer to FIG. 8. After forming the gap-filling metal layer 156, a planarization process is performed to remove superfluous metal layers 156, 154, 152, 108, 106 and superfluous high-k gate dielectric layer 104. Consequently, a first metal gate 180 and a second metal gate 182 are formed on the substrate 100.

Please still refer to FIG. 8. It is noteworthy that since the topmost portion of the U-shaped first work function metal layer 150u is lower than the opening of the first gate trench 140, a width of the opening the first gate trench 140 remains equal to a width of the second gate trench 142 during forming the gate trenches 140/142. That is, an aspect ratio of the first gate trench 160 is reduced and thus the second work function metal layer 152, the top barrier layer 154, the gap-filling metal layer 156 can be smoothly formed in the first gate trench 140. More important, because of the taper top 150T of the U-shaped first work function metal layer 150u, the second work function metal layer 152 can be formed more successfully and smoothly in the first gate trench 140.

According to the method for manufacturing the semiconductor device having the metal gates provided by the present invention, the taper top of the U-shaped first work function metal layer is obtained by performing the two-step etching process, and the taper top of the first work function metal layer provides a larger opening width, thus the metal layers are more easily formed in the gate trench. Consequently, the semiconductor device having the metal gates provided by the present invention has the advantage of superior gap-filling result and improved reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing semiconductor device having metal gates, comprising:
   providing a substrate comprising a first transistor and a second transistor formed thereon, the first transistor having a first gate trench formed therein and the second transistor having a second gate trench formed therein;
   forming a patterned first work function metal layer in the first gate trench;
   forming a second sacrificial masking layer respectively in the first gate trench and the second gate trench;

performing an etching process to remove portions of the patterned first work function metal layer to form a U-shaped first work function metal layer in the first gate trench; and performing a two-step etching process to remove the second sacrificial masking layer and portions of the U-shaped first work function metal layer from the first gate trench to form a taper top on the U-shaped first work function metal layer, wherein the two-step etching process comprises a strip step and a wet etching step.

2. The method for manufacturing the semiconductor device having the metal gates according to claim 1, further comprising sequentially forming a high-k gate dielectric layer, a bottom barrier layer and an etch stop layer in the first gate trench and the second gate trench before forming the patterned first work function metal layer.

3. The method for manufacturing the semiconductor device having the metal gates according to claim 1, further comprising:

forming a first work function metal layer in the first gate trench and the second gate trench; and removing portions of the first work function metal layer from the second gate trench and to form the patterned first work function metal layer in the first gate trench.

4. The method for manufacturing the semiconductor device having the metal gates according to claim 1, further comprising:

forming a first sacrificial masking layer in the first gate trench and the second gate trench after forming the patterned first work function metal layer, and the first gate trench and the second gate trench being filled up with the first sacrificial masking layer; and etching back the first sacrificial masking layer to form the second sacrificial masking layer in the first gate trench and the second gate trench, a top surface of the second sacrificial masking layer is lower than an opening of the first gate trench and an opening of the second gate trench.

5. The method for manufacturing the semiconductor device having the metal gates according to claim 4, wherein the first sacrificial masking layer and the second sacrificial masking layer comprise a bottom anti-reflection coating (BARC), or an ultraviolet light absorbing oxide (DUO) material layer.

6. The method for manufacturing the semiconductor device having the metal gates according to claim 1, wherein the strip step is performed in a plasma chamber.

7. The method for manufacturing the semiconductor devices having the metal gates according to claim 6, wherein the strip step comprises introducing a plasma without bombardment force.

8. The method for manufacturing the semiconductor device having the metal gates according to claim 6, wherein the strip step comprises introducing $H_2/N_2$ gas.

9. The method for manufacturing the semiconductor device having the metal gates according to claim 1, wherein the wet etching step comprising dilute HF (DHF).

10. The method for manufacturing the semiconductor device having the metal gates according to claim 1, further comprising sequentially forming a second work function metal layer, a top barrier layer and a gap-filling metal layer in the first gate trench and the second gate trench after performing the two-step etching process.

11. The method for manufacturing the semiconductor device having the metal gates according to claim 10, further comprising performing a planarization process to remove superfluous metal layers to a first metal gate and a second metal gate.

* * * * *